US006479216B1

(12) United States Patent

Vermeersch et al.

(10) Patent No.: US 6,479,216 B1

(45) Date of Patent: Nov. 12, 2002

(54) METHOD FOR OBTAINING A HEAT SENSITIVE ELEMENT BY SPRAY-COATING

(75) Inventors: Joan Vermeersch, Deinze (BE); Eric Verschueren, Merksplas (BE)

(73) Assignee: Agfa-Gevaert, Mortsel (BE)

( * ) Notice: Subject to any disclaimer, the term of this patent is extended or adjusted under 35 U.S.C. 154(b) by 81 days.

(21) Appl. No.: 09/659,691

(22) Filed: Sep. 11, 2000

Related U.S. Application Data

(60) Provisional application No. 60/155,770, filed on Sep. 27, 1999.

(30) Foreign Application Priority Data

Sep. 15, 1999 (EP) ............................................ 99203065

(51) Int. Cl.[7] .................................................. G03F 7/16

(52) U.S. Cl. .................... 430/302; 430/270.1; 430/964; 101/463.1

(58) Field of Search ............................. 430/302, 270.1, 430/964; 101/463.1

(56) References Cited

U.S. PATENT DOCUMENTS

| | | | | | |
|---|---|---|---|---|---|
| 4,626,484 | A | | 12/1986 | Nishioka et al. | |
| 4,781,941 | A | * | 11/1988 | Inukai et al. | 427/27 |
| 5,264,036 | A | | 11/1993 | Haas et al. | |
| 5,713,287 | A | * | 2/1998 | Gelbart | 101/467 |
| 6,136,503 | A | * | 10/2000 | Zheng et al. | 430/270.1 |
| 6,210,863 | B1 | * | 4/2001 | Cunningham et al. | 430/281.1 |
| 2001/0008104 | A1 | * | 7/2001 | Verschueren et al. | 101/463.1 |
| 2001/0008105 | A1 | * | 7/2001 | Verschueren et al. | 101/463.1 |
| 2001/0013297 | A1 | * | 8/2001 | Verschueren | 101/483 |
| 2002/0031724 | A1 | * | 3/2002 | Verschueren et al. | 430/302 |
| 2002/0053296 | A1 | * | 5/2002 | Verschueren et al. | 101/424 |
| 2002/0072013 | A1 | * | 6/2002 | Vander Aa | 430/202 |

FOREIGN PATENT DOCUMENTS

| | | | | | |
|---|---|---|---|---|---|
| EP | 0 429 234 | A2 | | 5/1991 | |
| EP | 0 674 230 | A1 | | 9/1995 | |
| EP | 0 770 495 | A1 | * | 5/1997 | |
| EP | 0 849 091 | A1 | * | 6/1998 | |
| EP | 001084830 | A1 | * | 3/2001 | B41C/1/10 |
| EP | 001084862 | A1 | * | 3/2001 | B41M/5/36 |

* cited by examiner

*Primary Examiner*—Janet Baxter
*Assistant Examiner*—Barbara Gilliam
(74) *Attorney, Agent, or Firm*—Breiner & Breiner, L.L.C.

(57) ABSTRACT

According to the present invention there is provided a method for obtaining a high quality printing plate by spraying a spray solution on a receiving surface, which is not a grained and anodized aluminum surface, characterized in that the pressure factor (PF) is lower than 200 mN/m, wherein $$PF = P/d \times (\sigma + \theta \text{ mN/m}^\circ)$$

PF: Pressure Factor (mN/m)
P: Spray Profile (mm)
d: distance between spray head and receiving surface (mm)
σ: surface tension (mN/m).
θ: Dynamic contact angle of the receiving surface with water at 2 s, contact time, and wherein the spray solution comprises hydrophobic thermoplastic polymer particles and a compound capable of converting light into heat.

8 Claims, No Drawings

METHOD FOR OBTAINING A HEAT SENSITIVE ELEMENT BY SPRAY-COATING

This application claims the benefit of U.S. Provisional Application No. 60/155,770 filed Sep. 27, 1999.

FIELD OF THE INVENTION

The present invention relates to a method for preparing a heat sensitive element by spray coating.

BACKGROUND OF THE INVENTION

Lithography is the process of printing from specially prepared surfaces, some areas of which are capable of accepting lithographic ink, whereas other areas, when moistened with water, will not accept the ink. The areas, which accept ink, form the printing image areas and the ink-rejecting areas form the background areas.

In the art of photolithography, a photographic material is made image-wise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat sensitive printing plate precursors is clearly seen on the market.

For example, Research Disclosure no. 33303 of January 1992 discloses a heat sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

EP-A-514 145 discloses a heat sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599 510 discloses a heat sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive group or precursor therefor, such that insolubilization of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilization. However the printing endurance of a so obtained printing plate is low.

EP-A-625 728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

U.S. Pat. No. 4,708,925 discloses a positive working imaging element including a photosensitive composition comprising an alkali-soluble novolac resin and an onium-salt. This composition can optionally contain an IR-sensitizer. After image-wise exposing said imaging element to UV—visible—or eventually IR-radiation followed by a development step with an aqueous alkali liquid there is obtained a positive working printing plate. The printing results of a lithographic plate obtained by irradiating and developing said imaging element are poor.

EP-A-96 200 972.6 discloses a heat sensitive imaging element comprising on a hydrophilic surface of a lithographic base an image forming layer comprising hydrophobic thermoplastic polymer particles dispersed in a water insoluble alkali soluble or swellable resin and a compound capable of converting light into heat, said compound being present in said image forming layer or a layer adjacent thereto, wherein said alkali swellable or soluble resin comprises phenolic hydroxy groups and/or carboxyl groups. However by exposure with short pixel times of said heat-sensitive imaging element there occurs ablation on the exposed areas resulting in an insufficient ink acceptance.

Analogous imaging elements comprising on a hydrophilic surface of a lithographic base an image forming layer comprising hydrophobic thermoplastic polymer particles dispersed in a water or alkali soluble or swellable resin and a compound capable of converting light into heat, said compound being present in said image forming layer or a layer adjacent thereto are disclosed in e.g. EP-A-770 494, EP-A-770 495, EP-A-770 496, EP-A-770 497, EP-A-773 112, EP-A-773 113, EP-A-774 364, EP-A-800 928, EP-A-96 202 685, EP-A-96 203 003, EP-A-96 203 004 and EP-A-96 203 633. In most of these applications poly(meth) acrylate latices are used as thermoplastic polymer particles and no specific hydrophilic resin is mentioned In most cases carbon black or an IR-dye are mentioned as the compound capable of converting light into heat.

In order to prepare an imaging element as described above, that is processable on the press, preferably IR-dyes should be used. Carbon black causes indeed a soiling on the press when removing the unexposed areas. On the other hand when using IR-dyes the unexposed areas are not completely dissolved when developing on the press resulting in scumming.

The appliance of the coatings which are used at the preparation of lithographic precursor plates happens mostly with coating techniques such as dipcoating, cascade coating and curtain coating. The use of spray techniques for applying lithographic layers fails usually at the attainable level of cosmetic quality of the end product. The conditions for high qualitative lithographic materials (thermal printing plates well or not processable on press) whereat high resolution, sensitivity and reproducing characteristics are required, are very high with relation with the cosmetic quality of said printing plate. This cosmetic quality can be translated as the presence of lines, the general evenness and the presence of a mottle pattern. This mottle pattern appears at the slightest presence clearly in the printing process of large raster surfaces.

OBJECTS OF THE INVENTION

It is an object of the present invention to provide the necessary parameters for obtaining a spray-coated layer with excellent cosmetic quality.

SUMMARY OF THE INVENTION

According to the present invention there is provided a method for obtaining a high quality printing plate by spraying a spray solution on a receiving surface, which is not a grained and anodized aluminum surface, characterized in that the pressure factor (PF) is lower than 200 mN/m, wherein $$PF=P/d\times(\sigma+\theta \text{ mN/m}^\circ)$$

PF: Pressure Factor (mN/m)

P: Spray Profile (mm)

d: distance between spray head and receiving surface (mm)

σ: surface tension (mN/m).

θ: Dynamic contact angle of the receiving surface with water at 2 s contact time

DETAILED DESCRIPTION OF THE INVENTION

To define the spray profile, under well-defined settings from solution and hardware, during 1 pass of the rotating drum, a line is sprayed without transverse movement of the spray head. To obtain the right spray pattern, as substrate a well swelling receiving layer, comprising gelatin, polyvinylpyrrolidone and polyethylene glycol (Agfajet Photograde Paper HP Glossy 165™, commercially available from Agfa-Gevaert) was used. This results in an immediate freezing of the spray pattern without the possibility of transverse flowing of the spray solution over the receiving surface. From this line, with the use of microdensitometry, the density profile of the line is measured. In the next step, the width at half height of this profile is divided by the total height (the maximum density) of the profile. This value is referred as profile value (P).

The spray profile is determined by the air pressure of the spraying head, by the flow rate of the spraying head and by the nature of the receiving surface.

This value lies preferably between 50 and 220 mm although this value has to be considered in the context of the given equation. The surface tension of the spray solution lies preferably between 22 mN/m and 60 mN/m.

The pressure factor is preferably lower than 125 mN/m

The distance between the spray head and the receiving member lies preferably between 25 and 100 mm.

The spray solution is preferably an aqueous solution, which may comprise surfactants, preferably fluorosurfactants. The viscosity of the spraying solution is preferably at least 1.5 mPa.s.

The dynamic contact angle of the receiving surface with water is preferably lower than 600 after 2 s contact time.

The receiving surface can be a drum with a lithographic surface, which can be incorporated in a printing machine. The receiving surface can be a lithographic surface mounted on a drum.

A preferred spraying solution is a dispersion of hydrophobic thermoplastic polymer particles in a hydrophilic binder. Said solution preferably includes thermoplastic particles of a homopolymer or a copolymer of styrene and a hydrophilic polymer containing carboxyl groups, and further a compound capable of converting light into heat.

Such solutions, suitable for spraying heat sensitive imaging elements are described with their exposure and development in EP-A-98 200 187.

The receiving element is a lithographic surface on a support layer with a hydrophilic support that is not a grained and anodized aluminum support. Preferably this lithographic surface on a support layer comprises a flexible support coated with a hydrophilic, more preferably with a hardened hydrophilic layer.

The imaging element, obtained by spraying the spray solution on the receiving element can after exposure to an IR-laser be developed by rinsing the element with an aqueous solution. Preferably the exposed imaging element is mounted directly on the press.

The following examples illustrate the present invention without limiting it thereto. All parts and percentages are by weight unless otherwise specified.

EXAMPLES

Preparation of Spray Solution

Spray Solution A

A 2.61 wt solution in water was prepared by mixing polystyrene latex, dye I and a hydrophilic binder. After spraying and drying, the resulting layer contained 75% W/W of the polystyrene latex, 10% of the dye A and 15% W/W of Glascol E 15™. Glascol E 15 is a polyacrylic acid, commercially available at N.V. Allied Colloids Belgium. Additionally, 5 ml/l of a fluorosurfactant was added. The structure of Dye I is as follows.

(I)

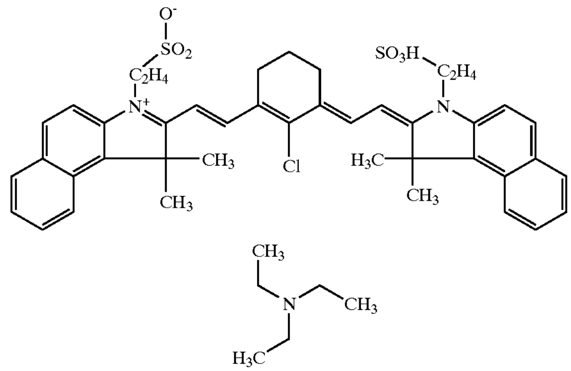

Spray Solution B

Spray solution B is identical to spray solution A, except that no fluorosurfactant was added.

Example 1

Preparation of the Lithographic Base

To 348 g of an aqueous dispersion comprising 25% by weight of $TiO_2$ with average particle size between 0.3 and 0.5 μm and 2.5% by weight of polyvinylalcohol (marketed by Wacker Chemie GmbH, under the trade name Polyviol WX™), 170 g of an aqueous dispersion of hydrolyzed tetramethoxysilane (22% by weight of hydrolyzed tetramethoxysilane) was added. To this mixture 10 g of a 4.1% by weight of the non ionic surfactant Akypo OP80™, available from Chemy, was added. Also 2 g of a 5% by weight of N-polyoxyethyleneethyl-perfluorooctanoic acid amide was added. The volume was adjusted to 1000 ml with distilled water. The pH was adjusted to 4.0 with NaOH. The solution was applied to a heat-set, biaxially oriented polyethylene terephthalate film with a thickness of 175 μm so that a total thickness of 6.83 g/m$^2$ of the coating was present. The coating was applied at a wet thickness of 50 μm and the film was dried under implement drying with air from 50° C. and a moisture content of 4 g/m$^3$.

Preparation of the Heat-mode Imaging Element

On above mentioned lithographic base was sprayed spray solution A. Therefore, the lithographic base was mounted on a drum, rotating at a line speed of 164 m/min. The imaging element was coated by a spray nozzle moving in transverse direction at a speed of 1.5 m/min. The spray nozzle was mounted on a distance of 60 mm between nozzle and receiving substrate. The flow rate of the spray solution was set to 7 ml/min. During the spray process an air pressure of $4.80\times10^5$ Pa was used on the spray head. The final coat weight is obtained by consecutively spraying during 6 passes of the spray head. This layer was dried on a temperature of 70° C. during the spraying process and additionally during 30 s. The spray nozzle was of the type SUJ1, an air assisted spray nozzle, commercially available at Spraying Systems Belgium, Brussels.

Example 2

Preparation of the Lithographic Base

To 332 g of an aqueous dispersion comprising 25% by weight of $TiO_2$ with average particle size between 0.3 and 0.5 μm and 2.5% by weight of polyvinylalcohol (marketed by Wacker Chemie GmbH, under the trade name Polyviol WX™), 79.1 g of an aqueous dispersion of hydrolyzed tetramethoxysilane (22% by weight of hydrolyzed tetramethoxysilane) was added. To this mixture 10 g of a 4.1% by weight of the non ionic surfactant Akypo Op80™, available from Chemy, was added. Also 2 g of a 5% by weight of N-polyoxyethyleneethyl-perfluorooctanoic acid amide was added. The volume was adjusted to 1000 ml with distilled water. The pH was adjusted to 4.0 with NaOH. The solution was applied to a heat-set, biaxially oriented polyethylene terephthalate film with a thickness of 175 μm so that a total thickness of 6.83 g/m$^2$ of the coating was present. The coating was applied at a wet thickness of 50 μm and the film was dried under implement drying with air from 50° C. and a moisture content of 4 g/m$^3$.

Preparation of the Heat-mode Imaging Element

The same spray solution and procedure was used as described in example 1.

Example 3

The same base was used as described in example 1

Preparation of the Heat-mode Imaging Element

On above mentioned lithographic base was sprayed spray solution B according to the procedure described in example 1 with the changed pressure setting to $6.21\times10^5$ Pa and a spray nozzle distance of 80 mm to the receiving surface.

Example 4

Preparation of the Lithographic Base

A receiving surface containing 200 mg/m$^2$ of polymethylmethacrylate latex (particle diameter between 25 and 300 nm), 20 mg/m$^2$ of colloidal silica with a surface area of 100 m$^2$/g, 10 mg/m$^2$ of a polyethylene wax, 7 mg/m$^2$ of polystyrene sulphonic acid, 3 mg/m$^2$ of poly(3,4-ethylenedioxythiophene) and 30 mg/m$^2$ of polymethylmethacrylate matting agent was coated on a heat-set, biaxially oriented polyethylene terephthalate film with a thickness of 175 μm.

Preparation of the Heat-mode Imaging Element

On above mentioned lithographic base was sprayed spray solution A according to the procedure described in example 1 with the changed pressure setting to $4.83\times10^5$ Pa and a spray nozzle distance of 60 mm to the receiving surface.

Example 5

Preparation of the Lithographic Base

A receiving surface containing 170 mg/m$^2$ of a latex of copoly(vinylidenechloride/methylmethacrylate/itaconic acid) and 40 mg/m$^2$ of silica with a surface area of 100 m$^2$/g were applied to a heat-set, biaxially oriented polyethylene terephthalate film with a thickness of 175 μm.

Preparation of the Heat-mode Imaging Element

On above mentioned lithographic base was sprayed spray solution A according to the procedure described in example 1.

Example 6

Preparation of the Lithographic Base

To a heat-set, biaxially oriented polyethylene terephthalate film with a thickness of 175 μm was applied a receiving surface, coated from a 23.6% wt aqueous solution adjusted to pH 4, with a wet coating thickness of 50 μm. This layer was, after chilling for 30 s at 10° C., dried at a temperature of 50° C. with a moisture content of the air of 4 g/m3 for at least 3 minutes. The resulting layer contained 9040 mg/m$^2$ of $TiO_2$, 900 mg/m$^2$ of $SiO_2$, 990 mg/m$^2$ of vinylalcohol, 250 mg/m$^2$ of Mylbond 211™, 23.6 mg/m$^2$ of Akypo OP80 and 0.25 mg/m$^2$ of a perfluorosurfactant.

In advance to the preparation of the coating solution a dispersion is made comprising the above mentioned $TiO_2$, $SiO_2$ and polyvinylalcohol.

Mylbond 211 is a chemically treated starch with an average particle size of 21 μm, commercially available at Amylum. For the $TiO_2$, Bayertitan RKB2, commercially available at Bayer, was used.

Preparation of the Heat-mode Imaging Element

On above mentioned lithographic base was sprayed spray solution A according to the procedure described in example 3 with the changed pressure setting to $7.58 \times 10^5$ Pa.

Example 7

The same base was used as described in example 2

Preparation of the Heat-mode Imaging Element

Spray solution A was sprayed following the procedure as described in example 6.

Example 8

The same base was used as described in example 5

Preparation of the Heat-mode Imaging Element

Spray solution A was sprayed following the procedure as described in example 6.

Example 9

The same base was used as described in example 4

Preparation of the Heat-mode Imaging Element

Spray solution A was sprayed following the procedure as described in example 6.

Example 10

The same base was used as described in example 3

Preparation of the Heat-mode Imaging Element

The same spray solution and procedure was applied as described in example 3 except the reduction of the distance between spray head and receiving surface from 80 till 35 mm.

Surface Tension of Spray Solutions

The surface tension of the spray solutions was measured by the common known Wilhelmy plate method. In this method the surface tension is calculated from the measured force to disrupt the contact between a platinum plate and the liquid surface.

| Spray Solution | Surface Tension (σ) |
|---|---|
| A | 34 mN/m |
| B | 56 mN/m |

Dynamic Contact Angle

The dynamic contact angle was determined by monitoring the geometry of a drop after falling on the receiving surface. Therefore, a commercially available measuring instrument, FibroDat 1121™ Dynamic absorption and contact angle tester, was used. A camera system coupled with frame grabber and image analysis system registrates the contact angle as function of time. This measurement was carried out 5 times for each receiving surface with distilled water. The mean of the values at 2 s contact time was calculated and represents the dynamic contact angle value.

The FibroDat instrument is marketed by Fibro Systems AB in Sweden

Calculation of Pressure Factor

The pressure factor (PF) is calculated by dividing the profile (P) by the distance between spray head and receiver in mm (d), followed by multiplication by the sum of the surface tension (σ) of the spray solution and the dynamic contact angle of water to the receiving surface (θ).

| Example | P | P/d | θ | σ | PF |
|---|---|---|---|---|---|
| 1 | 58 | 0.96 | 8 | 34 | 40.4 |
| 2 | 58 | 0.96 | 17 | 34 | 49.1 |
| 3 | 84 | 1.05 | 8 | 56 | 67.2 |
| 4 | 58 | 0.96 | 35.9 | 34 | 67.3 |
| 5 | 58 | 0.96 | 53 | 34 | 83.8 |
| 6 | 184 | 2.3 | 14.4 | 34 | 111.3 |
| 7 | 184 | 2.3 | 17 | 34 | 117.3 |
| 8 | 184 | 2.3 | 53 | 34 | 200.1 |
| 9 | 184 | 2.3 | 35.9 | 34 | 160.8 |
| 10 | 157 | 4.49 | 8 | 56 | 287.1 |

Cosmetic Quality

The plates after spraying and drying are inspected visually and given a quotation in respect to the uniformity level and mottle behavior.

In this procedure, the lower the value, the better the quality. A value of 0 represents a perfect quality. On the other hand a value of 5 represents a very bad quality.

For uniformity, a value of 1 is still acceptable. For the mottle behavior a value of 1 is unacceptable since this mottle is visualized in large screen planes in the printing process.

| | | Cosmetic quality | |
|---|---|---|---|
| Example | PF | Uniformity | Mottle |
| 1 | 40.4 | 0 | 0 |
| 2 | 49.1 | 0 | 0 |
| 3 | 67.2 | 0 | 0 |
| 4 | 67.3 | 0 | 0 |
| 5 | 83.8 | 0 | 0 |
| 6 | 111.3 | 0 | 0 |
| 7 | 117.3 | 0 | 0 |
| 8 | 200.1 | 1 | 0.5 |
| 9 | 160.8 | 0.5 | 0 |
| 10 | 287.1 | 4 | 4 |

From these results, it is very clear that by controlling a calculated spray profile multiplied by a spreading force parameter, a very good cosmetic quality of the sprayed coating can be obtained.

What is claimed is:

1. A method for obtaining a high quality printing plate by spraying a spray solution on a receiving surface, which is not a grained and anodized aluminum surface, wherein the pressure factor (PF) is lower than 200 mN/m, wherein $$PF = P/d \times (\sigma + \theta \text{ mN/m}^\circ)$$

PF: Pressure Factor (mN/m)

P: Spray Profile (mm)

d: distance between spray head and receiving surface (mm)

σ: surface tension (mN/m)

θ: Dynamic contact angle of the receiving surface with water at 2 s contact time, and wherein the spray solution comprises hydrophobic thermoplastic polymer particles and a compound capable of converting light into heat.

2. A method according to claim 1 wherein the pressure factor is lower than 125 mN/m.

3. A method according to claim 1 wherein said solution comprises a hydrophilic binder.

4. A method according to claim 1 wherein the receiving surface is a hydrophilic surface of a lithographic base.

5. A method according to claim 1 wherein the receiving material is a drum with a hydrophilic surface, capable of being incorporated in a printing machine.

6. A method according to claim 1 wherein the receiving surface is a lithographic plate with a hydrophilic surface mounted onto a drum.

7. A method according to claim 1 wherein the receiving surface is a hydrophilic coating on a flexible support.

8. A method according to claim 1 wherein the dynamic contact angle of the receiving surface with water is lower than 60° after 2 s contact time.

* * * * *